United States Patent
Wen et al.

(10) Patent No.: US 8,330,479 B2
(45) Date of Patent: Dec. 11, 2012

(54) TEST DEVICE HAVING A PLURALITY OF TIPS OF DIFFERENT HEIGHTS

(75) Inventors: Yoang-Coang Wen, Chiayi County (TW); Xin-Xion Liang, Taoyuan County (TW); Tao-Ming Lee, Taipei County (TW); Shan-Yu Yu, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 13/291,053

(22) Filed: Nov. 7, 2011

(65) Prior Publication Data

US 2012/0062264 A1    Mar. 15, 2012

Related U.S. Application Data

(62) Division of application No. 12/631,794, filed on Dec. 4, 2009, now Pat. No. 8,159,246.

(30) Foreign Application Priority Data

Sep. 30, 2009   (TW) ................. 98133267 A

(51) Int. Cl.
   *G01R 31/20* (2006.01)

(52) U.S. Cl. ......... 324/754.03; 324/754.11; 324/755.01; 324/760.01; 324/755.06; 324/755.07

(58) Field of Classification Search ............ 324/755.04, 324/755.07, 755.06

See application file for complete search history.

(56) References Cited

U.S. PATENT DOCUMENTS

| | | | | |
|---|---|---|---|---|
| 3,891,924 A * | 6/1975 | Ardezzone et al. | ...... | 324/754.07 |
| 5,764,072 A * | 6/1998 | Kister | ...... | 324/754.11 |
| 6,023,171 A * | 2/2000 | Boyette et al. | ...... | 324/755.07 |
| 7,602,203 B2 * | 10/2009 | Takekoshi | ...... | 324/754.11 |
| 7,612,572 B2 * | 11/2009 | Ishizuka | ...... | 324/755.11 |
| 2007/0018633 A1 * | 1/2007 | Hirakawa et al. | ...... | 324/72.5 |

* cited by examiner

*Primary Examiner* — Richard Isla Rodas
(74) *Attorney, Agent, or Firm* — Jianq Chyun IP Office

(57) ABSTRACT

A testing device suitable for a testing apparatus with light inspection of a display panel is provided, in which the testing device includes a main part and two contact parts. The testing device is fixed to the testing apparatus with light inspection by the main part. Two contact parts are respectively extended from two ends of the main part along a first direction, and each of the contact parts has a plurality of tips. The tips of each contact part have different heights. Besides, a testing apparatus is also provided. Therefore, the abovementioned testing device and the testing apparatus are able to drastically extend the user lifetime, improve the inspection accuracy and save cost.

8 Claims, 7 Drawing Sheets

TEST DEVICE HAVING A PLURALITY OF TIPS OF DIFFERENT HEIGHTS

CROSS-REFERENCE TO RELATED APPLICATION

This application is a divisional of and claims the priority benefit of U.S. application Ser. No. 12/631,794, filed on Dec. 4, 2009, now pending, which claims the priority benefit of Taiwan application serial no. 98133267, filed on Sep. 30, 2009. The entirety of each of the above-mentioned patent applications is hereby incorporated by reference herein and made a part of this specification.

BACKGROUND OF THE INVENTION

1. Field of the Invention

The invention is generally related to a testing device and a testing apparatus using the testing device. More particularly, the invention is related to a testing device having a plurality of tips and a testing apparatus using the testing device.

2. Description of Related Art

The rapid development of multimedia technology can be attributed to the progress in semiconductor components and display devices. As to display devices, liquid crystal displays (LCDs), with such advantages as high pixel quality, good spatial utilization, low power consumption and no radiation, have become a mainstream product in the display market.

At the end of a display panel fabrication process, a light inspection and an external appearance inspection are performed. The light inspection uses a contact probe electrically connected to a substrate terminal to inspect the display condition of the panel by driving signals that generate liquid crystal movement. Typically speaking, items to inspect include dot defects, line defects, mura defects (e.g., color mura, bright mura), etc.

With respect to the display panel fabrication process, typically the signal lines connected to each pixel unit in the display panel are externally pulled, in different groupings, to the corresponding test pads surrounding the display panel. During the inspection process, specialized diagnostic equipments are utilized in which a probe unit is respectively electrically connected with the testing pads on the display panel as well as a flexible printed circuit board having a driving chip. Moreover, test signals are transmitted to each pixel unit by pressing the probe unit on the test pads, whereby disconnects and color hues of components such as pixels and signal lines can be inspected.

However, in the aforementioned inspection method, the circuitry on the flexible printed circuit board are prone to be penetrated by the probe unit, causing disconnects and failure of the circuitry of the flexible printed circuit board. On the other hand, after operating for a period of time, the probe unit pressing on the test pads of the display panel is susceptible to gradual wear and tear. Therefore, the probe unit can no longer be firmly pressing on the test pads. Consequently, the device characteristic of the testing device changes, thereby causing judging errors in the testing results. Moreover, each of the two ends of the above-described probe unit has only one tip, respectively, meaning that after a tip of the probe unit wears down, the entire probe unit needs to be replaced. Therefore, the inspection cost increases.

SUMMARY OF THE INVENTION

An aspect of the invention provides a testing device, in which the user lifetime of the testing device is drastically lengthened.

An aspect of the invention provides a testing apparatus, in which the inspection accuracy of the testing apparatus is improved and the cost is reduced.

Another aspect of the invention provides a test device, suitable for a testing apparatus with light inspection of a display panel, the testing device including a main part and two contact parts. The testing device is fixed to the testing apparatus with light inspection by the main part. Two contact parts are respectively extended from two ends of the main part along a first direction, and each of the contact parts has a plurality of tips, and the tips of each of the contact parts have different heights.

An aspect of the invention provides a testing apparatus, suitable for light inspection of a display panel, and the testing apparatus has the above-described testing device.

In one embodiment of the invention, the above-described contact parts are arranged point symmetrically with each other.

In one embodiment of the invention, the distances between the tips are equidistant.

In one embodiment of the invention, each of the contact parts aforementioned are extended from two ends of the main part along a first direction, and by using the main part as an axis, the ends of each of the contact parts are bent along a second direction, so as to form the tips. The aforementioned second direction is a clockwise direction or a counter-clockwise direction, for example. More specifically, the tips of each of the contact parts include a main tip and at least a reserve tip, and in each of the contact parts, a turning angle of the main tip is larger than a turning angle of the reserve tip.

In one embodiment of the invention, in each of the contact parts, the aforementioned heights of the tips incrementally increase along a direction toward the main part. For example, the tips of each of the contact parts include a main tip and at least a reserve tip. The main tip is disposed on the end of each of the contact parts closer to the main part, and the reserve tip is disposed on the end of each of the contact parts away from the main part. Moreover, a length of the main tip of each of the contact parts is longer than a length of the reserve tip.

In one embodiment of the invention, the aforementioned testing apparatus can further include a test signal chipset. The test signal chipset includes a flexible printed circuit board and a test signal chip, the flexible printed circuit board has a plurality of signal traces, and a signal of the test signal chip is transmitted by a corresponding one of the signal traces and the testing device to a test pad of a display panel.

In one embodiment of the invention, the tips of each of the aforementioned contact parts include a main tip and at least a reserve tip. The testing device uses the main tip of one of the contact parts to connect with one of the signal traces on the flexible printed circuit board.

In one embodiment of the invention, the tips of each of the aforementioned contact parts include a main tip and at least a reserve tip. The testing device uses the reserve tip of one of the contact parts to connect with the signal traces on the flexible printed circuit board having a broken line.

In one embodiment of the invention, the aforementioned testing apparatus further includes a fixed shaft. The main part has a plurality of holes arranged along the first direction, and the fixed shaft is inserted through the holes so as to maintain the accuracy of the testing device.

In summary, by disposing a plurality of tips of different heights on each of the contact parts, the testing device of the invention as embodied herein can be suitable for various types of testing apparatuses. Moreover, by using a simple inverting mechanism, these contact parts can be interchanged, thereby drastically increasing the user lifetime of the testing device.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
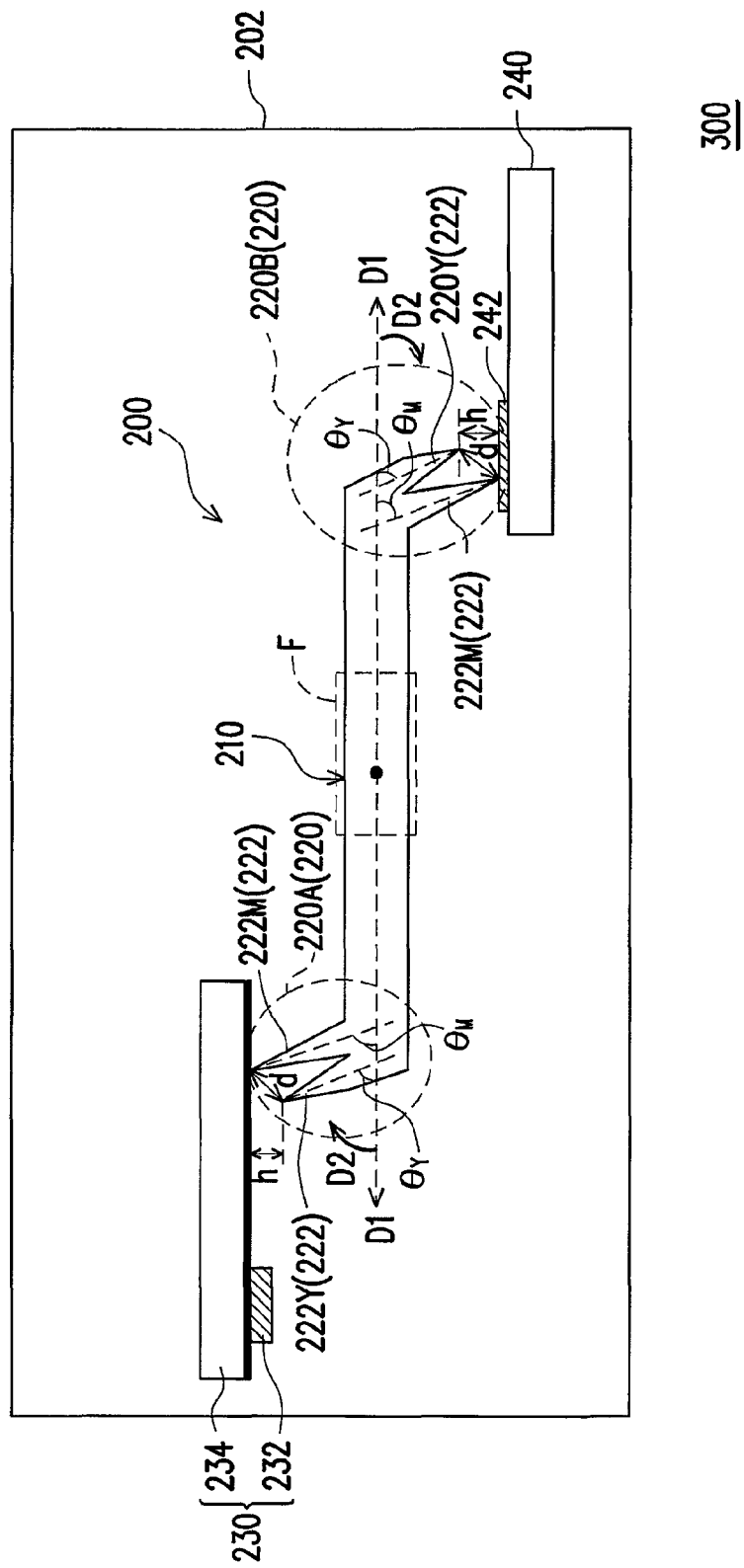
FIG. 1 is a schematic view of a testing apparatus in accordance with an embodiment of the invention.

FIG. 1 is a schematic view of a testing apparatus in accordance with an embodiment of the invention, in which a testing device is suitable for a testing apparatus with light inspection of a display panel. Referring to FIG. 1, a testing device 200 includes a main part 210 and two contact parts 220 disposed on two ends of the main part 210. The testing device 200 is fixed to a testing apparatus 300 with light inspection, in which a fixing location between the testing device 200 and the testing apparatus 300 is location F, for example. A fixing method is described hereinafter. In addition, a contact part 220A and a contact part 220B are respectively connected to a test signal chipset 230 and a test pad 242 of a display panel 240. The test signal chipset 230 includes a flexible printed circuit board 234 and a test signal chip 232. As shown in FIG. 1, the two parts 220 of the testing device 200 are respectively extended from two ends of the main part 210 along a first direction D1. Particularly, an end of each of the contact parts 220 has a plurality of tips 222, and the tips 222 of each of the contact parts 220 have different heights.

More specifically, since the end of each of the contact parts 220 has the plurality of tips 222, hence in an embodiment of the invention, when multiple contacts exist between the testing device 200 and the display panel 240 under testing or the test signal chip 232 of a signal source, signal resistance is reduced in the signal transmission path due to the increased amount of contact points. Moreover, the issue of signal strength decay is alleviated, thereby enhancing the inspection accuracy.

Furthermore, in each of the contact parts 220 of the present embodiment, the heights of the tips 222 incrementally increase in a direction toward the main part 210. Based on inspection accuracy and maintenance efficiency considerations, a height difference h between the tips 222 of each of the contact parts 220 is substantially 5 µm, for example. For instance, each of the tips 222 of each of the contact parts 220 includes a main tip 220M and at least a reserve tip 222Y. A quantity of the reserve tip 222Y can be a positive integer 1 or more, although the invention is not limited thereto.

The main tip 222M is disposed on the end of each of the contact parts 220 neighboring the main part 210. The reserve tip 222Y is disposed on the end of each of the contact parts 220 away from the main part 210. Moreover, a length of the main tip 222M of each of the contact parts 220 is longer than a length of the reserve tip 222Y. In a practical operation, when a single contact exists between the testing device 200 and the display panel 240 under testing or the test signal chip 232 of a signal source, after the main tip 222M is worn down from long periods of usage, the reserve tip 222Y can directly replace the main tip 222M to become a signal transmission path. Therefore, the lifetime of each of the contact parts 220 of the testing device 200 in the present embodiment can be extended. Moreover, according to the present embodiment, the distances d between the tips 222 are equidistant Therefore, during assembly the placement direction of the testing device 200 does not need to be specifically limited. Due to the ease of operation, the assembly time of the testing device 200 can be reduced, thereby increasing the equipment utilization rate.

Furthermore, the two contact parts 220 on the testing device 200 are arranged point symmetrically with each other, for example. More specifically, the two contact parts 220 on the testing device 200 are extended from the two ends of the main part 210 along the first direction D1. In the ends of each of the contact parts 220, the main part 210 is used as an axis, for example, to bend each of the contact parts 220 along a second direction D2, so as to form the main tip 222M and the reserve tip 222Y of the present embodiment. A turning angle $\theta_M$ of the main tip 222M is larger than a turning angle $\theta_Y$ of the reserve tip 222Y. In the present embodiment of the invention, the second direction is a clockwise direction, for example, whereas in another embodiment of the invention, the second direction D2 can be a counter-clockwise direction. In other words, for the testing device 200 of the present embodiment, the tips 222 of the two contact parts 220 are bent in a same clockwise direction with the first direction D1 as a reference. Accordingly, when the testing device 200 of the present embodiment is inverted, or turned 180 degrees along the clockwise direction, the shape of the inverted testing device 200 is still the same as before the inversion. Therefore, in practical operation, the two contact parts 220 of the testing device 200 can be interchanged with each other.

Figure 2:
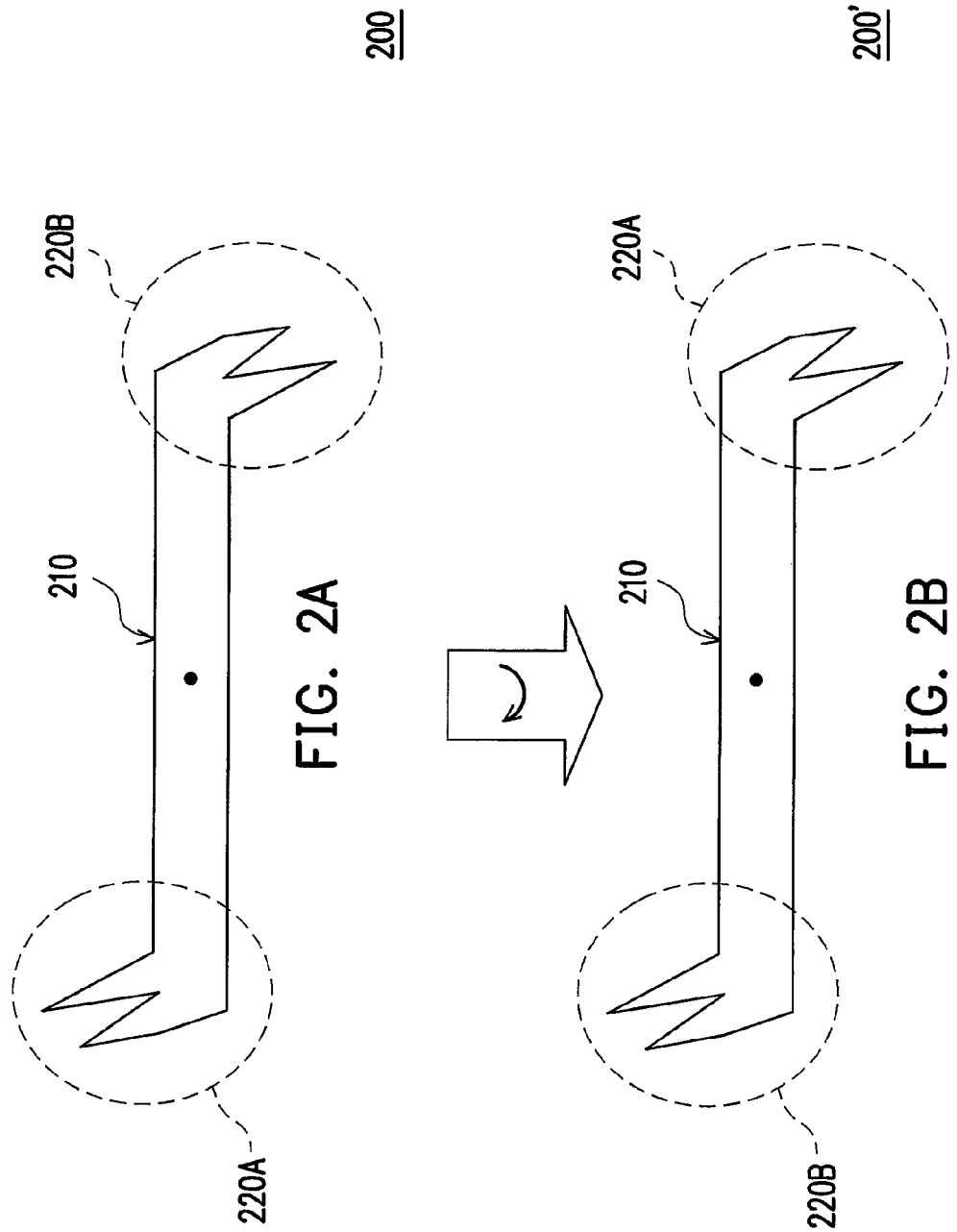
FIGS. 2A and 2B are schematic views respectively illustrating a testing device before and after inversion in accordance with an embodiment of the invention.

For example, FIGS. 2A and 2B are schematic views respectively illustrating a testing device before and after inversion in accordance with an embodiment of the invention. As shown in FIGS. 2A and 2B, since the two contact parts 220 of the testing device 200 are arranged point symmetrically with each other, the testing device 200 before inversion and a testing device 200' are the same type of testing device. In other words, after long periods of usage, the contact part 220A and the contact part 220B on the testing device 200 can be respectively connected to the test pad 242 of the display panel 240 and the test signal chip 232 even after inversion. Therefore, since the two contact parts 220 on the testing device 200 can be interchangeably used, the usable lifetime of the testing device can be further lengthened.

Figure 3:
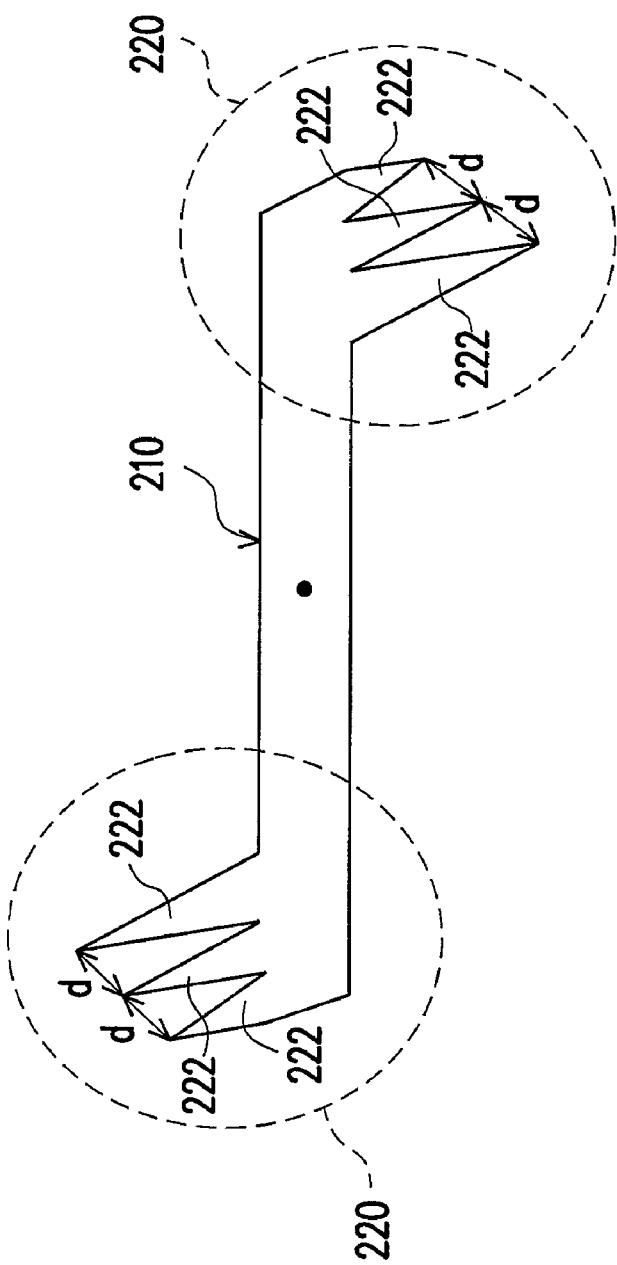
FIG. 3 is a schematic view of a testing device in accordance with another embodiment of the invention, in which the same elements are given the same reference symbols.

FIG. 3 is a schematic view of a testing device in accordance with another embodiment of the invention, in which the same elements are given the same reference symbols. As shown in FIG. 3, in a testing device 400 according to the present embodiment, the end of each of the contact parts has three tips 222. Therefore, with respect to each of the contact parts 220 on the testing device 400, the usable lifetime of one of the tips 222 is increased threefold. In the present embodiment of the invention, the distances d between the tips 222 of each of the contact parts 220 are equidistant. Therefore, besides drastic reduction in the assembly time of the testing device 400 and the increase in the equipment utilization rate, in terms of a production line, an user can more accurately estimate the maintenance cycle of the test apparatus. Hence, both the inspection accuracy and output of the production are enhanced.

Figure 4:
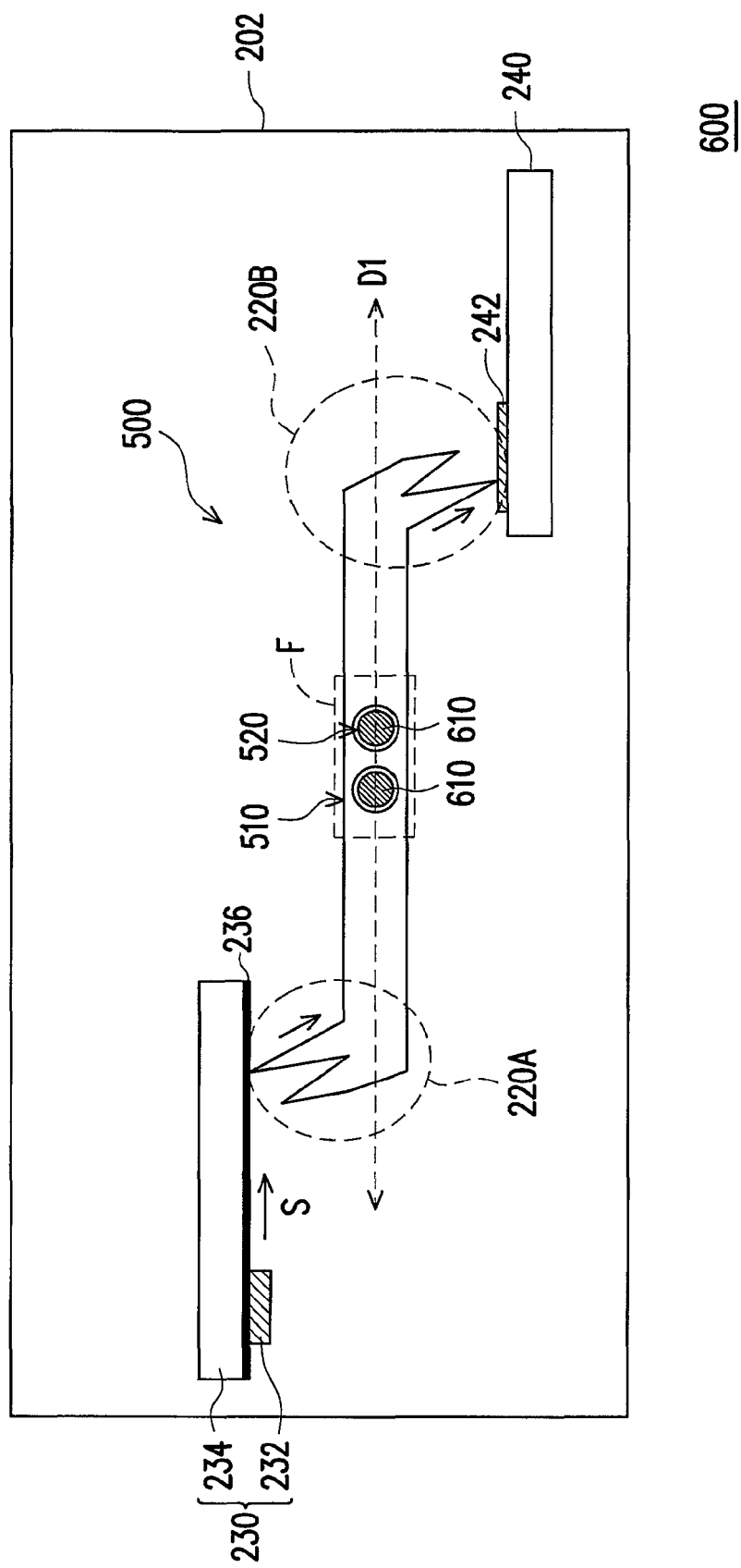
FIG. 4 is a schematic view of a testing apparatus in accordance with another embodiment of the invention, in which the same elements are given the same reference symbols.

FIG. 4 is a schematic view of a testing apparatus in accordance with another embodiment of the invention, in which the same elements are given the same reference symbols. Referring to FIG. 4, a main part 510 of a testing device 500 has a plurality of holes 520 arranged along the first direction D1, as shown in the two holes 520 depicted in FIG. 4. As FIG. 4 illustrates, a testing apparatus 600 further includes a fixed shaft 610. By insertion through the two holes 520, the fixed shaft 610 adjusts and maintains the accuracy of the testing device 500.

Practically, as shown in FIG. 4, while performing light inspection of the display panel, the test signal chipset 230 can be used as a test signal source. The test signal chipset 230 has the test signal chip 232 and the flexible printed circuit board 234, in which the flexible printed circuit board 234 has a plurality of signal traces 236. While performing an inspection process, a test signal S of the test signal chip 232 is transmitted by a corresponding one of the signal traces 236 and the testing device 200 to the test pad 242 of the display panel 240. In other words, the contact part 220A of the testing device 500 is used as an input terminal of the test signal S, for receiving the test signal S from the test signal chipset 230. Moreover, the contact part 220B of the testing device 500 is used as an output terminal of the test signal S, for outputting the test signal S of the test signal chipset 230 to the test pad 242 of the display panel 240.

Figure 5A:
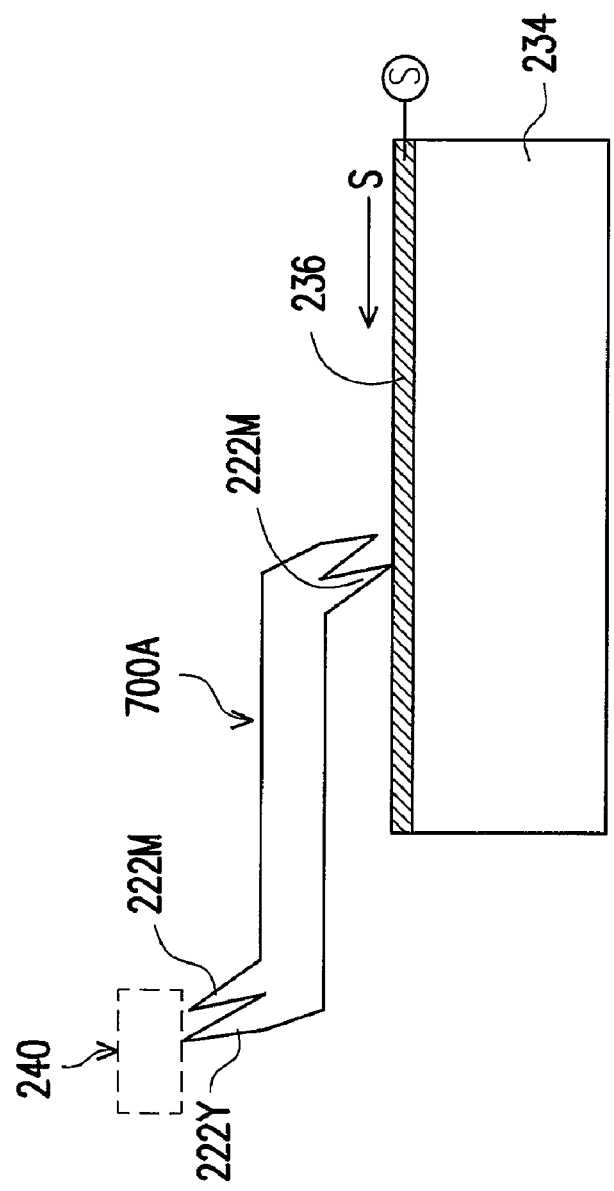
FIGS. 5A-5C are schematic views illustrating a process flow for using a testing device in accordance with an embodiment of the invention.
Figure 5B:
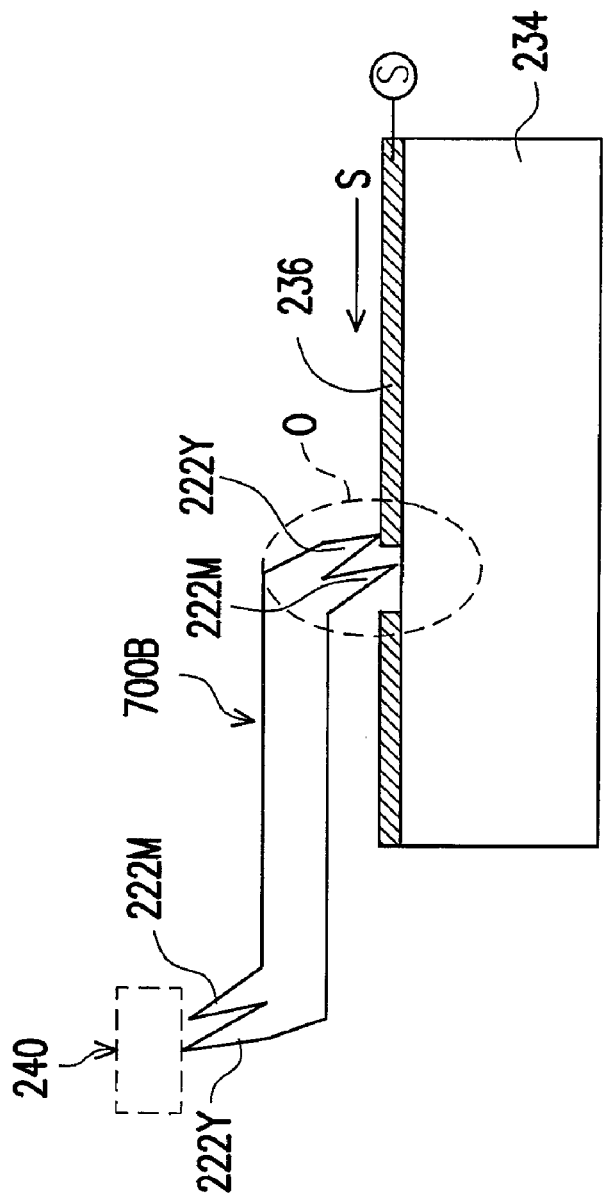
Figure 5C:
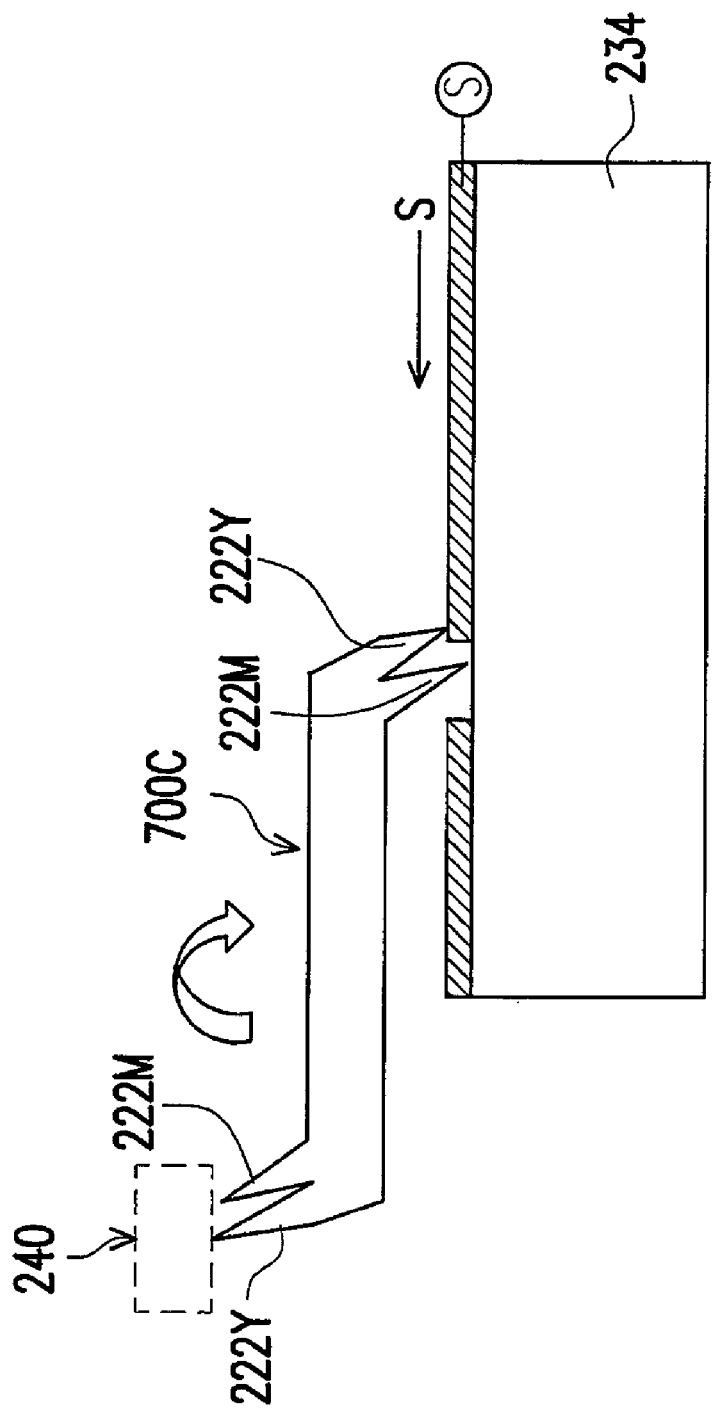

FIGS. 5A-5C are schematic views illustrating a process flow for using a testing device in accordance with an embodiment of the invention. As shown in FIG. 5A, when using a testing device 700A of a new product as a signal transmitting medium, each testing device 700A uses the main tip 222M to connect with the corresponding one of the signal traces 236 of the flexible printed circuit board 234. Next, as shown in FIG. 5B, after a period of operation, even if the signal traces 236 on the flexible printed circuit board 234 are penetrated by a testing device 700B whereby a broken line O occurs for the signal traces 236 on the flexible printed circuit board 234 and causing an open defect, due to the reserve tip 222Y being disposed at a farther outward position compared to the main tip 222M, the test signal S of the test signal chip 232 can still be transmitted to the display panel 240 through the corresponding one of the signal traces 236 and the testing device 700B. In other words, for this particular situation, the testing device 700B uses the reserve tip 222Y of one of the contact parts 220 to connect with the signal traces 236 on the flexible printed circuit board 234 having the broken line O. It should be noted that, as shown in FIG. 5C, when a single side of the contact parts 220 of a testing device 700C is worn out and inoperable, a maintenance personnel can maintain normal operation of the testing apparatus after directly inverting the testing device 700C.

In light of the foregoing, the testing device and the testing apparatus of the invention as embodied herein have all or a part of the following advantages:

By disposing a plurality of tips of different heights on each of the contact parts, the testing device can be suitable for various types of testing apparatuses. Moreover, by using a simple inverting mechanism, these contact parts can be interchanged, thereby drastically increasing the user lifetime of the testing device.

In one embodiment of the invention, by designing the tips to be disposed equidistant apart, during assembly the placement direction of the testing device does not need to be specifically limited. Due to the ease of operation, the assembly time of the testing device can be reduced, thereby increasing the equipment utilization rate.

In one embodiment of the invention, by designing the tips of each of the contact parts to be equidistant apart, the user can accurately estimate the maintenance cycle of the test apparatus. Hence, both the inspection accuracy and the output of production are enhanced.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A testing device having a plurality of tips suitable for a testing apparatus, the testing device comprising:

a main part, the main part has two long sides parallel to each other and has two length ends at two opposite side along the length direction of the main part, wherein the testing device is fixed to the testing apparatus by the main part; and two contact parts respectively extended from the two length ends of the main part along a first direction, wherein each of the contact parts has a plurality of tips for testing, and the tips of each of the contact parts have different heights, a connection between the two length ends of the main part which are respectively connected with the two contact parts having the plurality of tips is defined as an axis of the main part, the first direction is parallel to the axis of the main part, the tips of each of the contact parts comprise a main tip and at least a reserve tip, in each of the contact parts, one edge of the main tip is directly connected to one of the two long sides of the main part, and one edge of the reserve tip is directly connected to the other one of the two long sides of the main part, and in each of the contact parts, a turning angle $\theta_M$ formed between a central axis of the main tip and the axis of the main part, a turning angle $\theta_Y$ is formed between a central axis of the reserve tip and the axis of the main part, and the turning angle $\theta_M$ is larger than the turning angle $\theta_Y$.

2. The testing device as claimed in claim 1, wherein the contact parts are arranged point symmetrically with each other.

3. The testing device as claimed in claim 1, wherein the distances between the tips of each contact part are equidistant.

4. The testing device as claimed in claim 1, wherein each of the contact parts extends from two ends of the main part along the first direction, and by using the main part as an axis, the ends of each of the contact parts bend from the axis of the main part along a second direction, so as to form the tips.

5. The testing device as claimed in claim 1, wherein one contact part is located above the axis of the main part, and the other contact part is located below the axis of the main part.

6. The testing device as claimed in claim 1, wherein in each of the contact parts, the heights of the tips incrementally increase in a direction toward the main part.

7. The testing device as claimed in claim 6, wherein the tips of each of the contact parts comprise a main tip and at least a reserve tip, the main tip disposed on the end of each of the contact parts closer to the main part, the reserve tip disposed on the end of each of the contact parts away from the main part, and a length of the main tip of each of the contact parts is longer than a length of the reserve tip.

8. The testing device as claimed in claim 1, wherein the main part has a plurality of holes arranged along the first direction, and the testing device is fixed to the testing apparatus by the holes of the main part.

* * * * *